United States Patent
Gerhard et al.

(10) Patent No.: US 10,615,572 B2
(45) Date of Patent: Apr. 7, 2020

(54) SEMICONDUCTOR LASER DIODE

(71) Applicant: OSRAM OLED GMBH, Regensburg (DE)

(72) Inventors: Sven Gerhard, Alteglofsheim (DE); Christoph Eichler, Donaustauf (DE); Christian Rumbolz, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/101,147

(22) Filed: Aug. 10, 2018

(65) Prior Publication Data

US 2019/0052055 A1    Feb. 14, 2019

(30) Foreign Application Priority Data

Aug. 14, 2017   (DE) .................. 10 2017 118 477

(51) Int. Cl.

| | |
|---|---|
| *H01S 5/10* | (2006.01) |
| *H01S 5/32* | (2006.01) |
| *H01S 5/20* | (2006.01) |
| *H01S 5/22* | (2006.01) |
| *H01S 5/30* | (2006.01) |
| *H01S 5/042* | (2006.01) |
| *H01S 5/343* | (2006.01) |

(52) U.S. Cl.
CPC .......... *H01S 5/1003* (2013.01); *H01S 5/2031* (2013.01); *H01S 5/22* (2013.01); *H01S 5/3013* (2013.01); *H01S 5/3213* (2013.01); *H01S 5/3216* (2013.01); *H01S 5/0425* (2013.01); *H01S 5/34333* (2013.01); *H01S 2301/176* (2013.01)

(58) Field of Classification Search
CPC ........ H01S 5/1003; H01S 5/2031; H01S 5/22; H01S 5/3013; H01S 5/3213; H01S 5/3216; H01S 5/4025; H01S 5/34333; H01S 5/176
See application file for complete search history.

(56) References Cited

U.S. PATENT DOCUMENTS 5,880,028 A *  3/1999  Yamamoto ............... H01S 5/12
                                                         438/31
6,103,542 A *  8/2000  Pomp ................ H01L 21/30612
                                                         257/E21.22

(Continued)

*Primary Examiner* — Armando Rodriguez
(74) *Attorney, Agent, or Firm* — Slater Matsil, LLP

(57) ABSTRACT

A semiconductor laser diode is disclosed. In an embodiment a semiconductor laser diode includes a semiconductor layer sequence having at least one active layer and a ridge waveguide structure having a ridge extending in a longitudinal direction from a light output surface to a rear side surface and being delimited by ridge side surfaces in a lateral direction perpendicular to a longitudinal direction, wherein the ridge has a first region and a second region adjacent thereto in a vertical direction perpendicular to the longitudinal and lateral directions, wherein the ridge includes a first semiconductor material in the first region and at least one second semiconductor material different from the first semiconductor material in the second region, wherein the ridge has a first width in the first region, and wherein the ridge has a second width in the second region, the second width being larger than the first width.

24 Claims, 7 Drawing Sheets

(56) References Cited

U.S. PATENT DOCUMENTS

| | | | |
|---|---|---|---|
| 6,498,889 B2* | 12/2002 | Kinoshita | G02B 6/122 385/130 |
| 2005/0030995 A1 | 2/2005 | Kawakami et al. | |
| 2005/0121679 A1* | 6/2005 | Nagahama | B82Y 20/00 257/94 |
| 2012/0258557 A1* | 10/2012 | Yoshizumi | B82Y 20/00 438/33 |
| 2014/0328363 A1* | 11/2014 | Kwon | H01S 5/22 372/45.01 |
| 2016/0300592 A1 | 10/2016 | Kawakami et al. | |

* cited by examiner

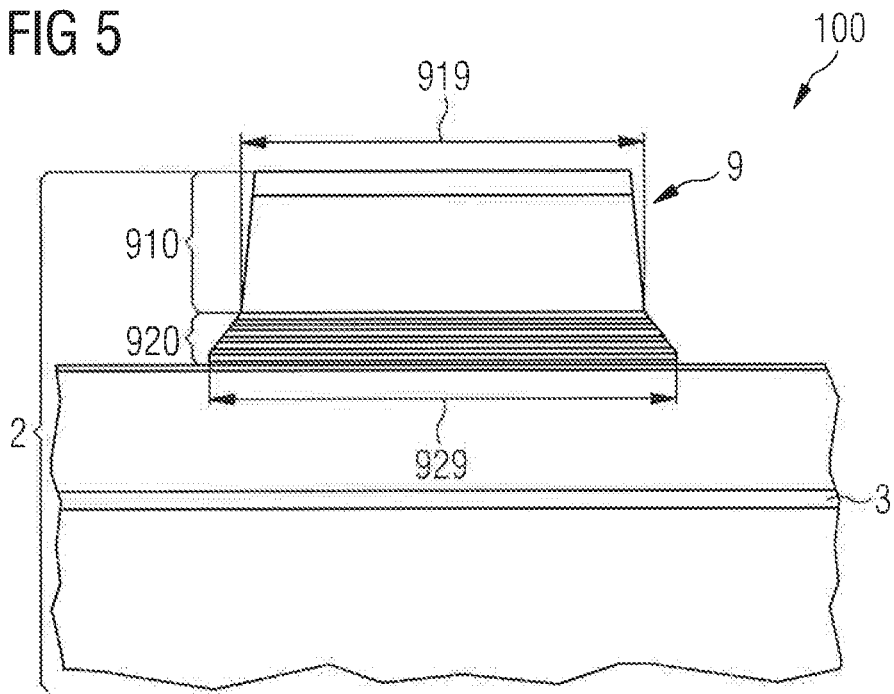
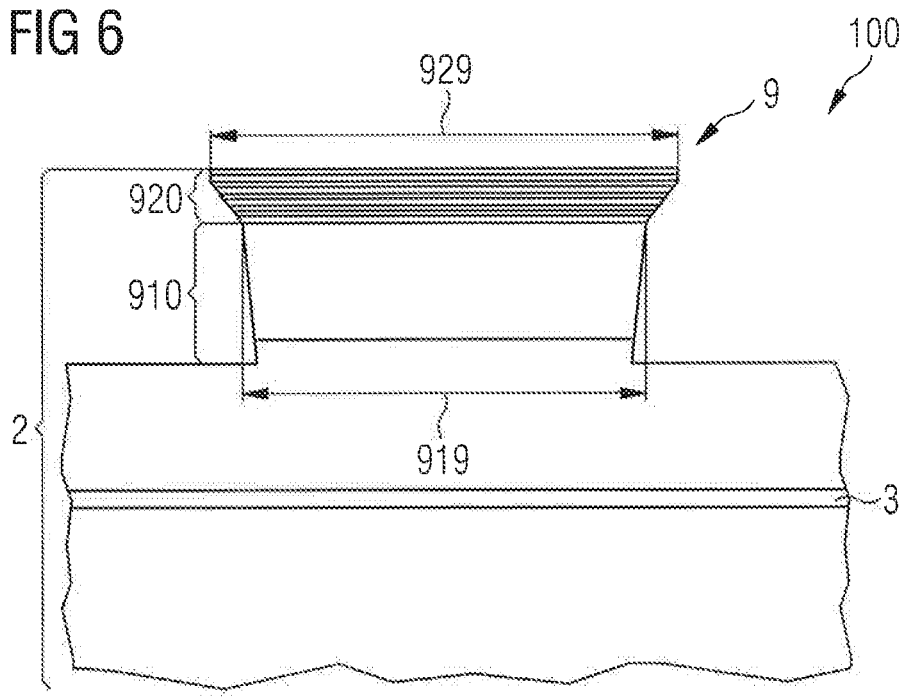

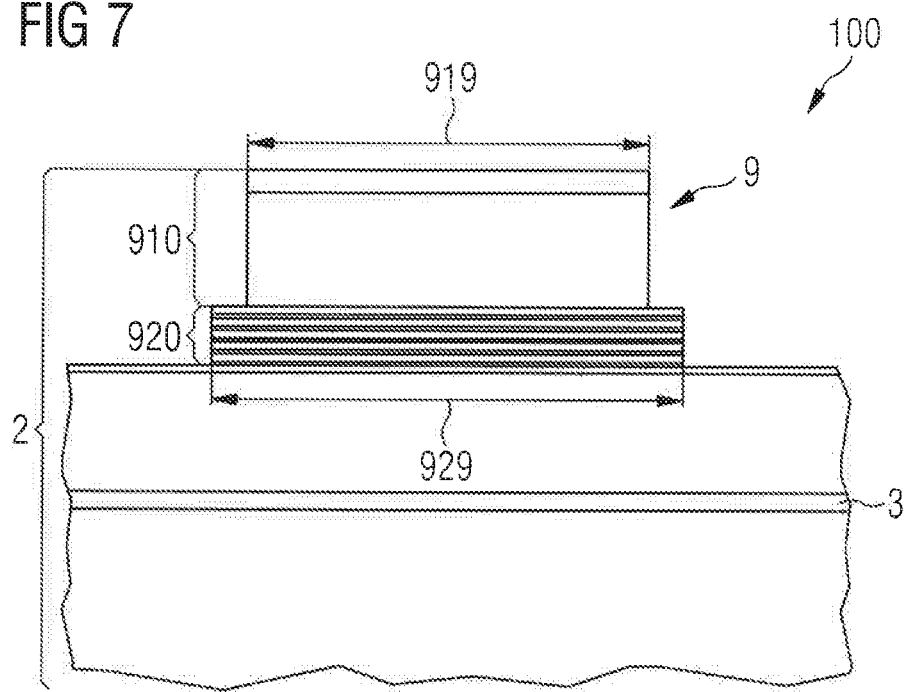
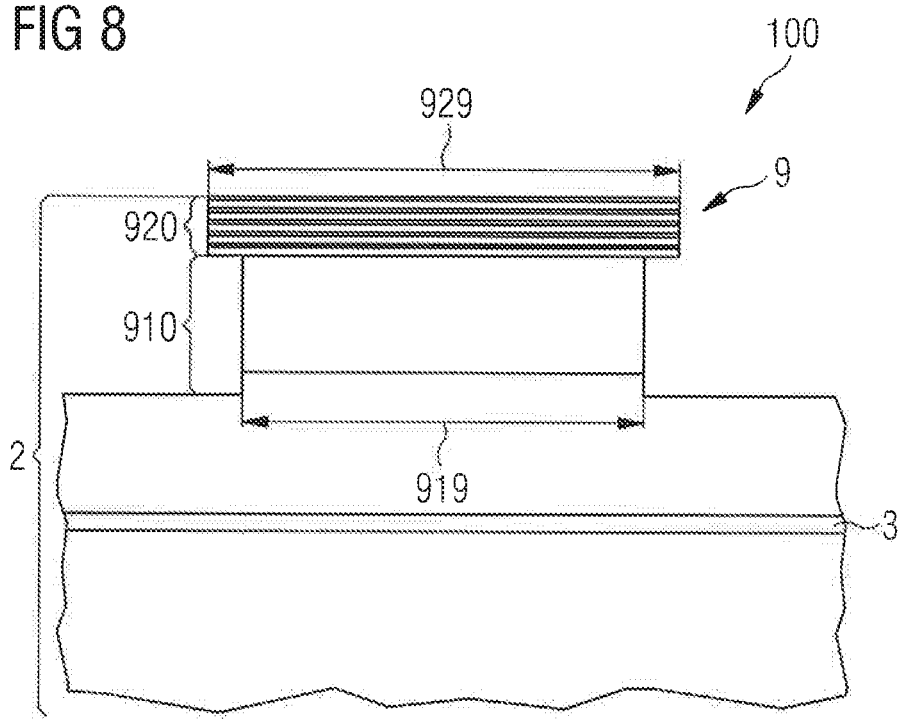

SEMICONDUCTOR LASER DIODE

CROSS-REFERENCE TO RELATED APPLICATIONS

This application claims the benefit of German patent application 102017118477.5, filed on Aug. 14, 2017, which application is hereby incorporated herein by reference.

TECHNICAL FIELD

A semiconductor laser diode is provided.

BACKGROUND

In laser diodes with a ridge waveguide structure, also known as a ridge, a lateral waveguiding takes place during operation through a refractive index jump between the ridge area and the material adjacent to the ridge, whereby one or more laser modes build up laterally in the active zone, defined inter alia by the ridge. The current injection into the diode, through which the active zone is electrically pumped into inversion, which makes laser operation possible, is effected by contacting the top region of the ridge. The optical mode(s) decays exponentially laterally outside the ridge area, while the current in the ridge is limited by the side walls and can only spread below the ridge due to the transverse electrical conductivity of the material located there. In order to obtain efficient devices with curves that are as linear as possible, however, it is necessary to bring the pumped area and the mode area to overlap as advantageously as possible. However, a change in the dimensions of the ridge always has an influence on the mode behavior and at the same time on the current conduction, which greatly limits the possibilities for optimizing this overlap.

Usually the definition of the ridge defines the mode guidance and the current spreading simultaneously and not independently of each other. There are known construction forms in which the width of the electrical contact on the ridge is varied in order to vary the local current imprint. However, the at least partially inevitably narrower contact area has the disadvantage that the operating voltage increases.

SUMMARY

Embodiments provide a semiconductor laser diode.

According to at least one embodiment, a semiconductor laser diode has at least one active layer which is designed and intended to generate light in an active region during operation. The active layer may in particular be part of a semiconductor layer sequence with a plurality of semiconductor layers and have a main extension plane perpendicular to an arrangement direction of the layers of the semiconductor layer sequence. For example, the active layer can have exactly one active region. The active region can be defined at least partially by a contact surface of the semiconductor layer sequence with an electrode layer, i.e., at least partially by a surface over which a current is injected into the semiconductor layer sequence and thus into the active layer. Furthermore, the active region can also be defined at least partially by a ridge waveguide structure, i.e., by a ridge formed in the semiconductor material of the semiconductor layer sequence in the form of an elongated elevation. In addition, the active layer can have a number of active regions, which can be defined by a corresponding number of the described measures. Although the features and embodiments described below mostly refer to a semiconductor laser diode with one active region in the active layer, and thus with exactly one ridge waveguide structure, the following embodiments also accordingly apply to semiconductor laser diodes with a plurality of active regions in the active layer and thus with a corresponding plurality of ridge waveguide structures.

According to a further embodiment, in a method for manufacturing a semiconductor laser diode, an active layer is produced which is set up and provided to generate light during operation of the semiconductor laser diode. In particular, a semiconductor layer sequence with the active layer can be produced using an epitaxial process. The embodiments and features described above and below apply equally to the semiconductor laser diode and to the method for manufacturing the semiconductor laser diode.

According to a further embodiment, the semiconductor laser diode has a light outcoupling surface and a rear side surface opposite the light outcoupling surface. The light outcoupling surface and the rear side surface can be in particular side surfaces of the semiconductor laser diode, especially preferably side surfaces of the semiconductor layer sequence, which can also be described as so-called facets. During operation, the semiconductor laser diode can emit the light generated in the active region via the light outcoupling surface. Suitable optical coatings, in particular reflecting or partially reflecting layers or layer sequences, which can form an optical resonator for the light generated in the active layer, can be applied to the light outcoupling surface and the rear side surface. The active region may extend between the rear side surface and the light outcoupling surface along a direction which is referred to as the longitudinal direction here and in the following. The longitudinal direction can be parallel to the main extension plane of the active layer. The direction of arrangement of the layers one above the other, i.e., a direction perpendicular to the main extension plane of the active layer, is referred to as the vertical direction here and in the following. A direction perpendicular to the longitudinal direction and perpendicular to the vertical direction is referred to as the lateral direction here and in the following. The longitudinal direction and the lateral direction can thus span a plane parallel to the main extension plane of the active layer.

The semiconductor layer sequence may be formed, in particular, as an epitaxial layer sequence, i.e., as an epitaxially grown semiconductor layer sequence. The semiconductor layer sequence in this case may be formed, for example, on the basis of InAlGaN. InAlGaN-based semiconductor layer sequences include, in particular, those in which the epitaxially produced semiconductor layer sequence normally has a layer sequence of differing individual layers, which includes at least one individual layer having a material from the III-V compound semiconductor material system $In_xAl_yGa_{1-x-y}N$, with $0 \leq x \leq 1$, $0 \leq y \leq 1$ and $x+y \leq 1$. In particular, the active layer may be based on such a material. Semiconductor layer sequences that have at least one InAlGaN-based active layer may preferably, for example, emit electromagnetic radiation in an ultraviolet to green wavelength range.

Alternatively or additionally, the semiconductor layer sequence may also be based on InAlGaP, i.e., the semiconductor layer sequence may have differing individual layers, of which at least one individual layer, for example, the active layer, has a material from the III-V compound semiconductor material system $In_xAl_yGa_{1-x-y}P$, with $0 \leq x \leq 1$, $0 \leq y \leq 1$ and $x+y \leq 1$. Semiconductor layer sequences that have at least one InAlGaP-based active layer may preferably, for example, emit electromagnetic radiation having one or more spectral components in a green to red wavelength range.

Alternatively or additionally, the semiconductor layer sequence may also have other III-V compound semiconductor material systems, for example, an InAlGaAs-based material, or II-VI compound semiconductor material systems. In particular, an active layer that has an InAlGaAs-based material may be suitable for emitting electromagnetic radiation having one or more spectral components in a red to infrared wavelength range. A II-VI compound semiconductor material system may have at least one element from the second main group, such as, for example, Be, Mg, Ca, Sr, and one element from the sixth main group, such as, for example, O, S, Se. For example, the II-VI compound semiconductor materials include: ZnSe, ZnTe, ZnO, ZnMgO, CdS, ZnCdS and MgBeO.

The active layer and in particular the semiconductor layer sequence with the active layer can be applied to a substrate. For example, the substrate can be designed as a growth substrate on which the semiconductor layer sequence is grown. The active layer, and in particular the semiconductor layer sequence with the active layer, can be produced by means of an epitaxial process, for example, by means of metal-organic vapor phase epitaxy (MOVPE) or molecular beam epitaxy (MBE). In particular, this can mean that the semiconductor layer sequence is grown on the growth substrate. Furthermore, the semiconductor layer sequence can be provided with electrical contacts in the form of electrode layers. In addition, it may also be possible to remove the growth substrate after the growth process. In this case, for example, after growth the semiconductor layer sequence can also be transferred to a substrate embodied as a carrier substrate. The substrate may comprise a semiconductor material, such as a compound semiconductor material system mentioned above, or another material. In particular, the substrate may comprise or be of sapphire, GaAs, GaP, GaN, InP, SiC, Si, Ge and/or a ceramic material such as SiN or AlN.

The active layer, for instance, may have a conventional pn junction, a double heterostructure, a single quantum well structure (SQW structure) or a multiple quantum well structure (MQW structure) or quantum dots for light generation. In addition to the active layer, the semiconductor layer sequence can comprise further functional layers and functional regions, such as p- or n-doped charge carrier transport layers, i.e., electron or hole transport layers, undoped or p- or n-doped confinement, cladding or waveguide layers, barrier layers, planarization layers, buffer layers, protective layers and/or electrode layers and combinations thereof. Furthermore, additional layers, such as buffer layers, barrier layers and/or protective layers, can also be arranged perpendicular to the growth direction of the semiconductor layer sequence, for example, around the semiconductor layer sequence, i.e., on the side surfaces of the semiconductor layer sequence.

According to a further embodiment, the semiconductor layer sequence has at least one ridge waveguide structure. If the semiconductor laser diode has a substrate on which the semiconductor layer sequence is applied, the ridge waveguide structure is formed in a top side of the semiconductor layer sequence opposite the substrate. Even if the semiconductor laser diode has no substrate, the side with the ridge waveguide structure is referred to here and in the following as the top side. The ridge waveguide structure can be formed in particular by a ridge-shaped raised region of the semiconductor layer sequence extending in the longitudinal direction, i.e., by a ridge extending in the longitudinal direction from the light output surface to the rear side surface, which projects vertically beyond surface regions adjacent to the ridge in the lateral direction. The ridge can be delimited in the vertical direction with a ridge top side and delimited in the lateral direction by ridge side surfaces. The side surfaces defining the ridge waveguide structure in the lateral direction can form a stepped profile, especially with the laterally adjacent surface areas of the top side of the semiconductor layer sequence. The terms "ridge-shaped region", "ridge" and "ridge waveguide structure" may be used synonymously in the following. Furthermore, the semiconductor layer sequence may also have a plurality of ridge-shaped regions, which are arranged laterally side by side and spaced from each other, wherein each of the ridge-shaped regions extends in the longitudinal direction, and for which the following features accordingly apply.

According to a further embodiment, the ridge has at least a first region and a second region, which differ in at least one property selected from width, material and course of the side surfaces. The first region and the second region can be arranged one above the other, particularly in a vertical direction, and adjoin each other. It is possible that the ridge is formed completely by only one or more first regions and one or more second regions, so that the ridge can consist of the first and second regions.

According to a further embodiment, the ridge has a first semiconductor material in the first region and at least one second semiconductor material different from the first semiconductor material in the second region. For example, the first region may be formed by the first semiconductor material. Alternatively, the first region may contain at least one other semiconductor material in addition to the first semiconductor material. If the first region has different semiconductor materials, they can be formed in particular in layers in the first region, so that the first region can be formed by a layer stack with at least two semiconductor layers, of which at least one layer has the first semiconductor material. Furthermore, the second region can be formed by the second semiconductor material. Alternatively, the second region may contain at least one other semiconductor material in addition to the second semiconductor material. If the second region has different semiconductor materials, they can be formed in particular in layers in the second region, so that the second region can be formed by a layer stack with at least two semiconductor layers, of which at least one layer has the second semiconductor material.

According to a further embodiment, the ridge has at least one hetero-interface in the second region. The hetero-interface can be formed in particular by two semiconductor layers arranged one above the other and adjacent to one another, which have different semiconductor materials from one another. Accordingly, the ridge can have at least two layers of different semiconductor materials in the second region. By forming at least one hetero-interface it may be possible to use the piezoelectric effect and the formation of a two-dimensional charge carrier gas at the interface, so that it may be possible to achieve an amplification of the current spreading. The second region may also have a number of hetero-interfaces, which may make it possible to further amplify or even maximize the current spreading by means of the effects mentioned. Accordingly, the ridge in the second region may, for example, comprise a plurality of semiconductor layers, with directly adjacent semiconductor layers each comprising different semiconductor materials. In particular, the ridge may also have a periodic sequence of a plurality of at least two semiconductor layers with different semiconductor materials in the second region, one of the at least two semiconductor layers comprising or being made of the second semiconductor material. Due to the measures described, in particular due to the formation of one or more hetero-interfaces, it may be possible that the ridge has a superlattice structure in the second region, which can have a positive effect on the current spreading properties of the second region due to the effects described above.

According to a further embodiment, the ridge has a first width in the first region and a second width in the second region. The width of a region may in particular be a property selected from a maximum width, an average width, and a width variation, i.e., a change in width depending on a vertical position in the respective ridge region, where the width of the ridge waveguide structure refers to measurements in the lateral direction. The ridge is therefore not embodied with a uniform width, but has a width variation depending on a vertical position in the ridge due to the different widths of the first and second region.

According to a further embodiment, the second width is larger than the first width. The second region can therefore preferably have a region that is wider than the entire first region, for example. The wider region can be part of the second region or can be the whole second region. In the latter case, the transition from the first to the second region may be in particular stepped in terms of width, so that the ridge side surfaces at the transition from the first to the second region may have a step. Alternatively, the transition from the first to the second region can also be continuous in terms of width, so that the first and second regions are adjacent with the same width and the second region becomes wider as the distance to the first region increases. The ridge waveguide structure can therefore have inclined ridge sides at least in the second region.

For example, the ridge may have a second width in the second region that increases in the direction towards the active layer. Furthermore, the second region may be located between the first region and the active layer, especially when widening towards the active layer. In addition, the second region can form a pedestal region of the ridge, i.e., the region with which the ridge waveguide structure adjoins the rest of the semiconductor layer sequence. In this case, in particular, it may further be advantageous if the semiconductor layer sequence between the active region and the ridge has a semiconductor layer, which is directly adjacent to the second region and which has the same semiconductor material as the second region.

Furthermore, the ridge can have a second width in the second region that decreases in the direction towards the active layer. Furthermore, the first region may be located between the second region and the active layer, especially if the second width is reduced towards the active layer. Furthermore, the second region, especially in the aforementioned case, can form a top side region of the ridge, i.e., with the top side of the ridge, in particular that part of the ridge waveguide structure with which the ridge waveguide structure terminates in the vertical direction on the side facing away from the active layer.

According to a further embodiment, the first region has a constant first width. In other words, the first region has essentially the same width regardless of its vertical position. Alternatively, the first region can also have a varying first width. For example, in the first region the ridge may have a width that increases in the direction towards the active layer. Alternatively, the ridge can have a width in the first region that decreases in the direction towards the active layer. If the first and second regions have a varying width, in particular an increasing width, the change in width of the second region may preferably be greater than the change in width of the first region.

As already described above, the ridge can have more than a first and/or more than a second region. The ridge can have two second regions between which the first region is arranged and which each have a second semiconductor material and a larger width than the first region. The two second regions may be the same or different in terms of material and/or width, wherein each of the second regions may have one or more of the features described above. In particular, one of the two second regions can form a pedestal region of the ridge waveguide structure, while the other of the two second regions can form a top side region of the ridge.

According to a further embodiment, the ridge has a ridge height in the vertical direction. The ridge height can be in particular the vertical distance of the ridge top side to the surface regions of the top side of the semiconductor layer sequence laterally adjacent to the ridge. Accordingly, in the vertical direction the first region can have a first height and the second region can have a second height. Especially preferably the second region can have a second height in the vertical direction which is greater than or equal to 2% and less than or equal to 65% of the ridge height. The ridge height can typically be in the range of 500 nm, the second height can typically be in the range of about 80 nm.

According to a further embodiment, the ridge has a maximum first width $B_{max,1}$ in the first region and a maximum second width $B_{max,2}$ in the second region with $\Delta B=(B_{max,2}-B_{max,1})/2$, which is a measure for the lateral indentation of the second region relative to the first region, preferably with $0.01\% \leq \Delta B/B_{max,1} \leq 20\%$ and particularly preferably with $0.02\% \leq \Delta B/B_{max,1} \leq 10\%$. Particularly preferred values for the first width can be greater than or equal to 1 µm and less than or equal to 3 µm, typically about 2 µm. Furthermore, $\Delta B$ may preferably be greater than or equal to 2 nm or greater than or equal to 10 nm or greater than or equal to 15 nm and less than or equal to 1 µm or less than or equal to 300 nm or less than or equal to 150 nm.

According to a further embodiment, in the second region the ridge side surfaces, or at least a part thereof, can be inclined by an angle $\alpha$ to a plane spanned by the longitudinal and lateral directions, wherein for the angle $\alpha$ preferably: $20° \leq \alpha \leq 100°$ and preferably $20° \leq \alpha \leq 90°$. In other words, the ridge side surfaces in the second region can at least partially form a slant inclined by the described angle $\alpha$ to the surface regions of the top side of the semiconductor layer sequence laterally adjacent to the ridge waveguide structure. An angle $\alpha=90°$ for at least one region of the second region therefore means that the ridge side surface in this region is perpendicular to the described plane spanned by the longitudinal and lateral directions. Side surfaces or parts thereof with an angle $\alpha<90°$ or $\alpha>90°$ are also referred to as inclined side surfaces here and in the following.

According to a further embodiment, the semiconductor layer sequence is based on a nitride compound semiconductor material, i.e., InAlGaN, which can also include InGaN, AlGaN and GaN. In this case, the first semiconductor material may particularly preferably have or be AlGaN, while the second semiconductor material, which is different from the first semiconductor material, comprises $Al_xIn_yGa_{1-x-y}N$ with $0 \leq x \leq 0.2$ and $0 \leq y \leq 0.2$.

In the semiconductor laser diode described herein, a part of the ridge waveguide structure, i.e., a part of the ridge, can be produced as a superlattice with several epitaxial materials in accordance with the previously described embodiments, the superlattice region having a different width and shape than the remaining region of the ridge waveguide structure, which can also be designated as a "bulk" of the ridge waveguide structure or as a "ridge bulk". The region designed as a superlattice can be slanted or stepped, for example, as described above. By those means, the mode behavior of the laser diode and the overlap of the mode region with the electrically pumped area or the current spreading in the laser diode can be specifically adjusted. This can make it possible to obtain semiconductor laser diodes with lower laser threshold, higher efficiency and very linear characteristics. An additional advantage can be given by the fact that a passivation overmolding of the ridge waveguide structure is better possible with slanted edges, which can lead to a higher quality and yield.

BRIEF DESCRIPTION OF THE DRAWINGS

Further advantages, advantageous embodiments and developments are given by the exemplary embodiments described in the following in conjunction with the figures.

In the figures:

FIGS. 3 to 12 show schematic illustrations of sections of semiconductor laser diodes according to further embodiments.

In the exemplary embodiments and figures, elements that are the same, of the same type or have the same effect are in each case denoted by the same references. The elements represented and their relative size ratios are not to be regarded as true to scale, but instead the size of individual elements such as, for example, layers, components, devices and regions may be exaggerated to aid illustration and/or to aid comprehension.

DETAILED DESCRIPTION OF ILLUSTRATIVE EMBODIMENTS

Figure 1A:
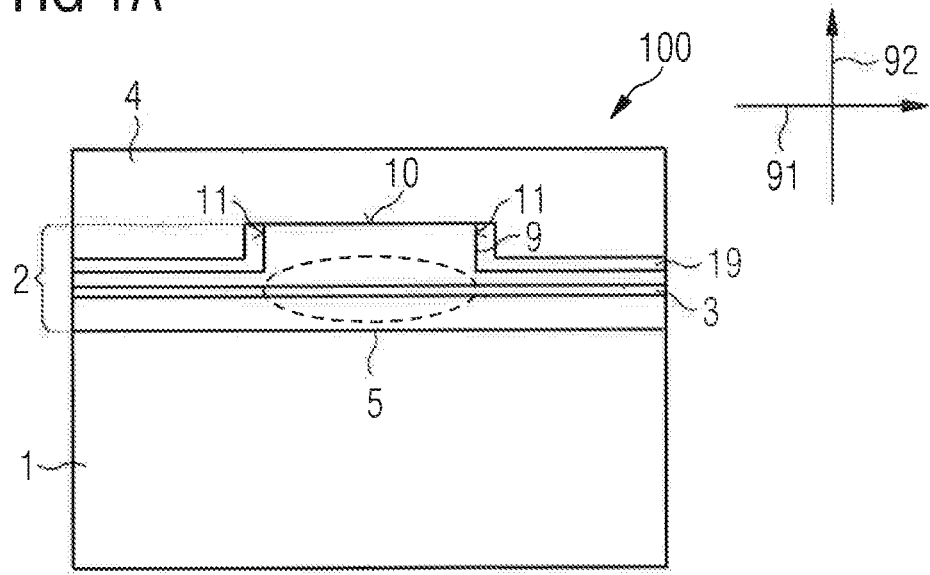
FIGS. 1A and 1B show schematic illustrations of a semiconductor laser diode according to an embodiment.
Figure 1B:
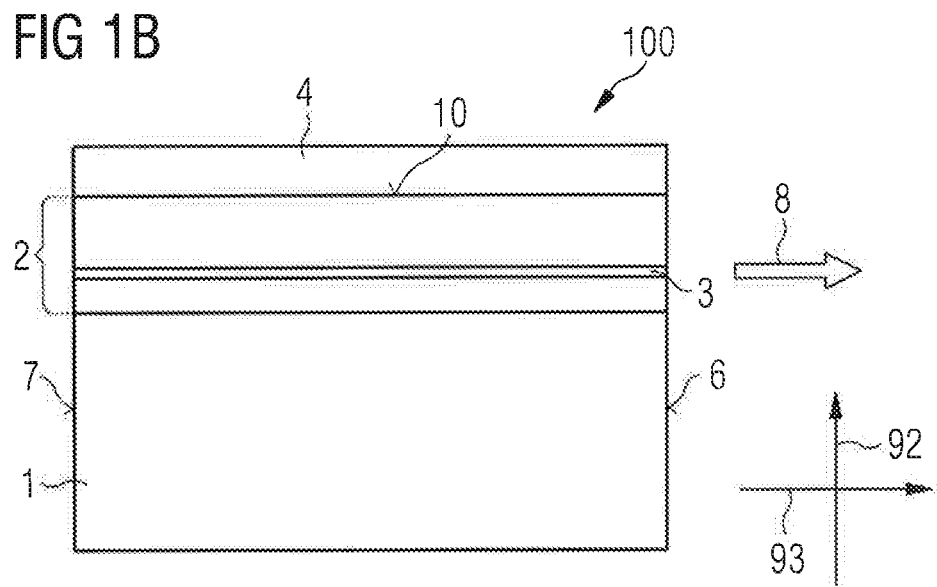

FIGS. 1A and 1B show an example of a semiconductor laser diode 100, wherein FIG. 1A shows a sectional view with a sectional plane parallel to a lateral direction 91 and to a vertical direction 92 and FIG. 1B shows a sectional view through the semiconductor laser diode wo with a sectional plane parallel to the vertical direction 92 and to a longitudinal direction 93. The following description refers equally to FIGS. 1A and 1B. Although the following description refers to preferred embodiments of semiconductor laser diodes based on nitride compound semiconductor materials, i.e., InAlGaN, the described embodiments and features also accordingly apply to semiconductor laser diodes based on other compound semiconductor material systems.

The semiconductor laser diode wo has a substrate 1, which is, for example, a growth substrate for a semiconductor layer sequence 2 epitaxially grown thereon. Alternatively, substrate 1 can also be a carrier substrate to which a semiconductor layer sequence 2 grown on a growth substrate is transferred after growing. For example, substrate 1 may be GaN on which a semiconductor layer sequence 2 based on an InAlGaN compound semiconductor material has grown. In addition, other materials, in particular as described in the general part, are also possible for substrate 1 and semiconductor layer sequence 2. Furthermore, it is also possible that the semiconductor laser diode 100 is free of a substrate. In this case, the semiconductor layer sequence 2 may have been grown on a growth substrate which is subsequently removed. The semiconductor layer sequence 2 has an active layer 3 which is suitable for generating light 8 in operation, especially when the laser threshold is exceeded, and emitting laser light via a light outcoupling surface 6.

As indicated in FIGS. 1A and 1B, here and in the following a lateral direction 91 refers to a direction which, for example, runs parallel to a main direction of extension of the layers of the semiconductor layer sequence 2 when viewed onto the light outcoupling surface 6. The arrangement direction of the layers of the semiconductor layer sequence 2 on top of each other and of the semiconductor layer sequence 2 on the substrate 1 is referred to as vertical direction 92 here and in the following. The direction perpendicular to the lateral direction 91 and to the vertical direction 92, which corresponds to the direction along which the light 8 is emitted, is referred to as longitudinal direction 93 here and in the following.

An electrode layer 4 is applied to a side of the semiconductor layer sequence 2, which is remote from the substrate 1 and forms an upper side of device 100. The electrode layer 4 is provided and set up for the electrical contacting of the semiconductor layer sequence 2. For example, the electrode layer 4 may contain one or more of the following metals or materials: Ag, Al, Au, Pt, Pd, Ni, Rh, Ti, ITO. The semiconductor laser diode wo can have an additional electrode layer for electrical contacting of the other side of the semiconductor layer sequence 2, which is not shown for the sake of clarity.

In addition to the active layer 3, the semiconductor layer sequence 2 can have additional semiconductor layers, such as cladding layers, waveguide layers, barrier layers, current spreading layers and/or current delimiting layers, which are not shown in order to simplify the representation. For example, the semiconductor layer sequence 2 on the substrate 1 may have a buffer layer, a first cladding layer above it and a first waveguide layer above the first cladding layer, on which the active layer 3 is applied. At least a second waveguide layer, a second cladding layer and a semiconductor contact layer can be applied over the active layer 3. For example, if the semiconductor layer sequence 2 is based on an InAlGaN compound semiconductor material as mentioned above, the buffer layer may contain undoped or n-doped GaN, the first cladding layer may contain or be made of n-doped AlGaN, the first waveguide layer may contain or be made of n-doped GaN, the second waveguide layer may contain or be made of p-doped GaN, the second cladding layer may contain or be made of p-doped AlGaN and the semiconductor contact layer may contain or be made of p-doped GaN, or may be derived therefrom. For example, Si can be used as n-dopant, Mg as p-dopant. The active layer 3 can be formed by a pn junction or by a quantum well structure with a multiplicity of layers, which are formed, for example, by alternating layers with or from InGaN and GaN. In the case of such a semiconductor layer sequence, the substrate can, for example, comprise or be n-doped GaN.

The upper side of the semiconductor layer sequence 2 facing away from the substrate 1, with the exception of the contact region of the semiconductor layer sequence 2 with the electrode layer 4, is covered with a passivation material 19 which, for example, has or can be an electrically insulating oxide, nitride or oxynitride, such as silicon dioxide, silicon nitride, silicon oxynitride, aluminum oxide, tantalum oxide, rhodium oxide, niobium oxide and/or titanium dioxide. In addition, other oxides, nitrides and oxynitrides are also possible with one or more materials selected from Al, Ce, Ga, Hf, In, Mg, Nb, Rh, Sb, Si, Sn, Ta, Ti, Zn and Zr.

Furthermore, reflective or partially reflective layers or layer sequences may be applied to the light outcoupling surface 6 and the opposite rear side surface 7, which form the side surfaces of the semiconductor layer sequence 2 and the substrate 1. Said reflective or partially reflective layers or layer sequences are not shown for the sake of clarity and which are provided and arranged to form an optical resonator in the semiconductor layer sequence 2.

In the upper side of the semiconductor layer sequence 2 facing away from the substrate 1, a ridge waveguide structure 9 is formed by removing a part of the semiconductor material from the side of the semiconductor layer sequence 2 facing away from the substrate 1. The ridge top side 10 forms the upper contact area of the semiconductor layer sequence 2 with the electrode layer 4. The ridge waveguide structure 9 runs in the longitudinal direction 93 and is delimited on both sides in the lateral direction 91 by ridge side surfaces 11. The ridge side surfaces 11 and the remaining top side of the semiconductor layer sequence 2 laterally adjacent to the ridge side surfaces 11 are covered by the passivation material 19 described above. The refractive index jump at the ridge side surfaces 11 caused by the transition from the semiconductor material to the passivation material 19 can cause a so-called index guiding of the light generated in the active layer 3, which can significantly lead to the formation of an active region 5, which indicates the area in the semiconductor layer sequence 2, in which the generated light is guided and amplified in laser operation.

As shown in FIG. 1A, the ridge waveguide structure 9 can be formed by completely removing the semiconductor material laterally on both sides of the ridge. Alternatively, a so-called "tripod" can also be formed in which the semiconductor material is laterally removed only along two channels next to the ridge.

In the following figures, which represent sections of the semiconductor laser diode 100 according to the sectional view shown in FIG. 1A, characteristics of the previously described ridge waveguide structure 9 are described in further embodiments. The following description therefore mainly refers to variants of the ridge waveguide structure 9 of the semiconductor laser diode 100 described in conjunction with FIGS. 1A and 1B. For the sake of clarity, the electrode layer 4, which preferably contacts the entire ridge top side 10 as shown in FIG. 1A, and the passivation material 19 are not shown in the following figures.

Figure 2A:
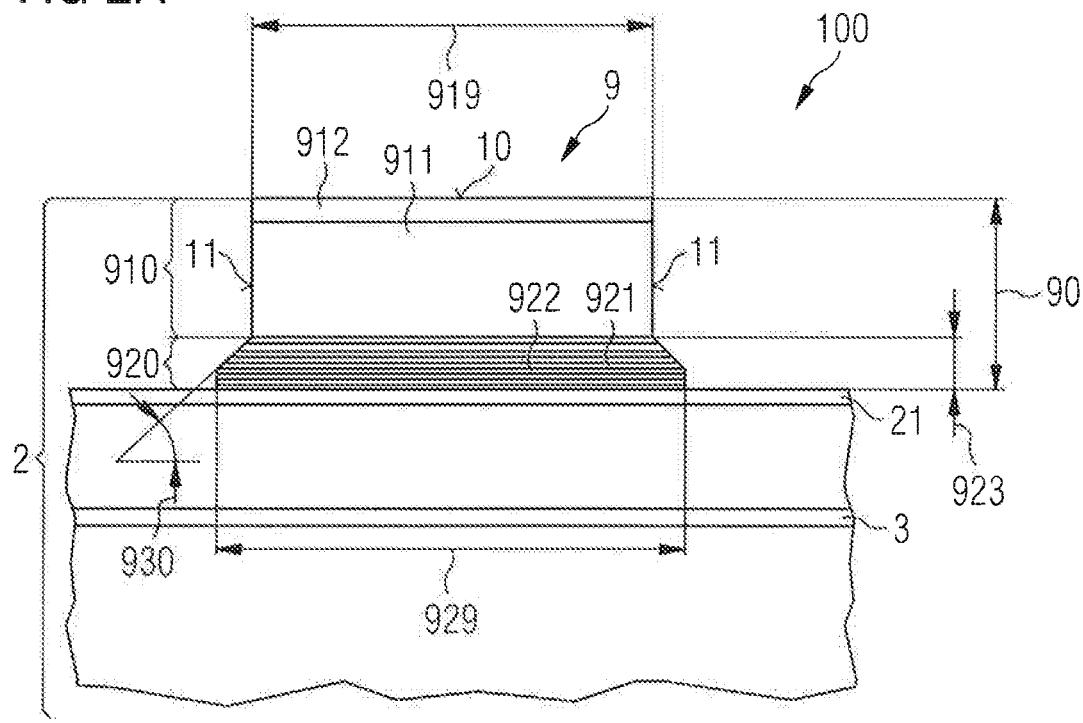
FIGS. 2A and 2B show schematic illustrations of a semiconductor laser diode according to a further embodiment.
Figure 2B:
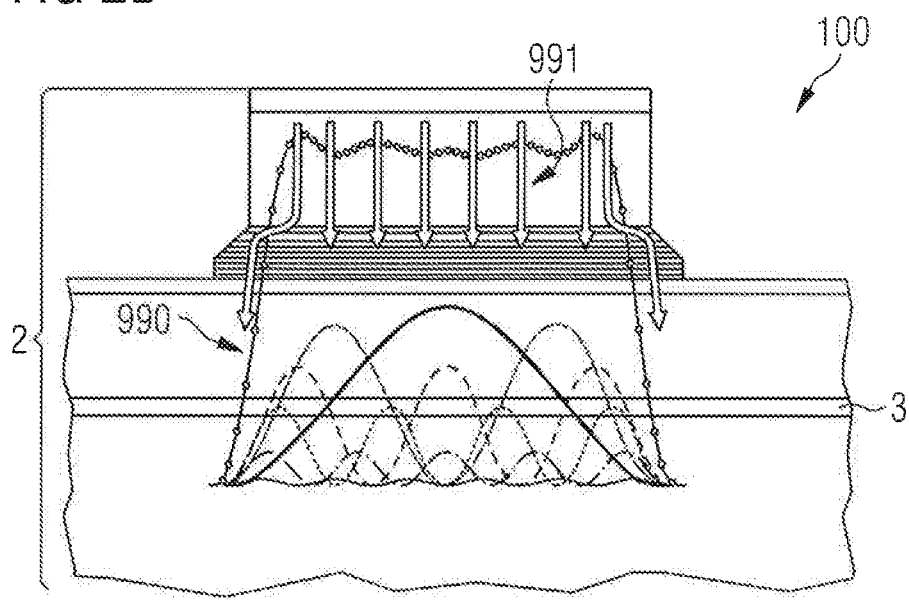

FIGS. 2A and 2B show an embodiment of a semiconductor laser diode 100 having a ridge waveguide structure 9 with a first region 910 and a second region 920 arranged vertically one above the other and adjacent to each other. The first region 910 and the second region 920 differ in this embodiment as well as in the following embodiments with regard to the width and/or the material and/or the course of the side surface. In the embodiment of FIGS. 2A and 2B, the first and second regions 910, 920 differ in all these properties.

The first region 910 comprises at least one semiconductor layer 911 with a first semiconductor material, while the second region 920 comprises at least one semiconductor layer 921 with a second, different semiconductor material. With regard to the nitride compound semiconductor material system described in the present embodiments, the first semiconductor material of the first range 910 may have or be particularly preferably AlGaN. The second semiconductor material of the second range 920 can preferably have or be $Al_xIn_yGa_{1-x-y}N$ with $0 \leq x \leq 0.2$ and $0 \leq y \leq 0.2$. For example, the second region 920 may have GaN or InGaN as the second semiconductor material. In addition to the semiconductor layer 911 in the embodiment shown, the first region 910 has a further semiconductor layer 912, which forms a semiconductor contact layer, by means of which the ridge top side 10 and thus the top side of the semiconductor layer sequence 2 contacts the top electrode layer. In other words, the first region 910 contains another semiconductor material, different from the first semiconductor material. In the embodiment shown, the second region 920 also has at least one further semiconductor material in addition to the second semiconductor material. The second semiconductor material and the other semiconductor material of the second region 920, which is or has AlInGaN with a composition different from the second semiconductor layer 921, are each formed as semiconductor layers 921, 922. As shown, the ridge waveguide structure 9 in the embodiment shown thus comprises in the second region 920 a plurality of semiconductor layers 921, 922 which are applied alternately to one another, so that directly adjacent semiconductor layers of the second region 920 each comprise different semiconductor materials. Such a periodic sequence of a plurality of at least two semiconductor layers 921, 922 with different semiconductor materials forms a superlattice with several hetero-interfaces which, as described above in the general part, can improve the current spreading. As an alternative to the shown first and second region 910, 920 having several semiconductor layers each, the first and second region 910, 920 can also be formed only by the first and second semiconductor material described above.

The second region 920 is located between the active layer 3 and the first region 910 and forms a pedestal region of the ridge waveguide structure 9, i.e., the ridge waveguide structure 9 is adjacent, with the second region 920, to the part of the semiconductor layer sequence 2 that does not belong to the ridge waveguide structure 9, so that the second region 920 forms a step profile with the laterally adjacent surface regions of the top side of the semiconductor layer sequence 2. Especially in this case it can be advantageous if the semiconductor layer sequence 2 has a semiconductor layer 21 between the active layer 3 and the ridge waveguide structure 9, which is directly adjacent to the second region 920 and which has the same semiconductor material as the second region 920. In other words, the second region 920 has at least one semiconductor layer containing the same material as the semiconductor layer 21. In particular, when viewed from the active layer, this semiconductor layer of the second region 920 can be the lowermost semiconductor layer of the second region, so that the semiconductor layer of the second region, which has the same semiconductor material as the semiconductor layer 21, and the semiconductor layer 21 can directly adjoin each other. The lowermost semiconductor layer of the second region 920 and the semiconductor layer 21 can therefore merge into one another even without a recognizable layer boundary.

Furthermore, the ridge waveguide structure 9 is not designed with a uniform width, but shows a width variation depending on a vertical position. In particular, the ridge waveguide structure 9 has a first width 919 in the first region 910 and a second width 929 in the second region 920. In the shown embodiment, the widths of the ranges are the respective maximum widths as shown in FIG. 2A. Alternatively, they can also be average widths or the respective variation of width. In particular, the second width 929 of the second region 920 is larger than the first width 919 of the first region 910, so that the second region 920, in at least one region or, as shown, substantially completely, is wider than the first region 910, wherein the first and second regions 910, 920 adjoin each other with the same width. If the maximum width of the first region 910, i.e., the first width 919 in the shown embodiment, is denoted as $B_{max,1}$ and the maximum width of the second region 920, i.e. the second width 929 in the shown embodiment, as $B_{max,2}$, then $\Delta B=(B_{max,2}-B_{max,1})/2$ represents a measure for the indentation from the second region 920 relative to the first region 910. It was found that said widths are preferably chosen so that $0.01\% \leq \Delta B/B_{max,1} \leq 20\%$ or particularly preferably $0.02\% \leq \Delta B/B_{max,1} \leq 10\%$. Preferred values for the first width 919 can be greater than or equal to 0.5 µm and less than or equal to 100 µm, particularly preferably greater than or equal to 1 µm and less than or equal to 50 µm. Furthermore, 2 nm $\leq \Delta B \leq$ 1000 nm or preferably 10 nm $\leq \Delta B \leq$ 300 nm or particularly preferably 15 nm $\leq \Delta B \leq$ 150 nm may apply.

Furthermore, the ridge waveguide structure 9 has inclined ridge side surfaces in the second region 920, so that the width of the ridge waveguide structure 9 increases continuously in the second region 920 at least in one region towards the active layer 3. The ridge side faces 11 partly form an incline in the second region which is inclined by the angle 930 to the plane indicated in FIG. 2A, which is formed by surface regions of the top side of the semiconductor layer sequence laterally adjacent to the ridge waveguide structure 9. The angle 930 can preferably be larger or equal to 20° and smaller or equal to 100°, particularly preferably smaller or equal to 90°. The first region 910, on the other hand, has a constant width 919 in the shown embodiment.

Furthermore, the described ridge waveguide structure 9 has a ridge height 90. It has been found that the pedestal region of the ridge waveguide structure 9 formed by the second region 920 preferably has a second height 923 in the range of greater than or equal to 2% and less than or equal to 65% of the ridge height 90. For example, in a particularly preferred embodiment the ridge height 90 can be about 500 nm, while the second height 923 can be about 80 nm.

For manufacturing the described ridge waveguide structure 9 one or more suitable etching processes can be carried out, for example, whose parameters are set in such a way that the described structure is formed. This allows the current injection to be adapted in the region of the ridge waveguide structure 9 so that the current spreading towards the active layer can be optimized. As described, the current spreading region is designed as a superlattice region with a larger width, which has AlInGaN layers of different composition in the shown embodiment. In this way it may be possible to use the piezoelectric effect and the formation of two-dimensional charge carrier gases at the interfaces to achieve maximum current spreading without significantly influencing the waveguiding of the modes. This allows the lateral mode distribution and the current spreading to be specifically matched to each other in order to achieve an optimum overlap of both. FIG. 2B shows the lateral laser modes 990 and the current flow 991, the latter being visibly spread by the described structure in the ridge waveguide structure 9. The adaptation of mode structure and current spreading can enable a higher efficiency, a lower threshold current and a more linear characteristic curve.

The following figures show modifications of the embodiment described in connection with FIGS. 2A and 2B. The description of the following figures therefore mainly refers to the differences to the respective previous embodiments. Apart from the differences described above, the examples of the following figures may show features according to the respective previous embodiments, even if not all features are explicitly described any more.

Figure 3:
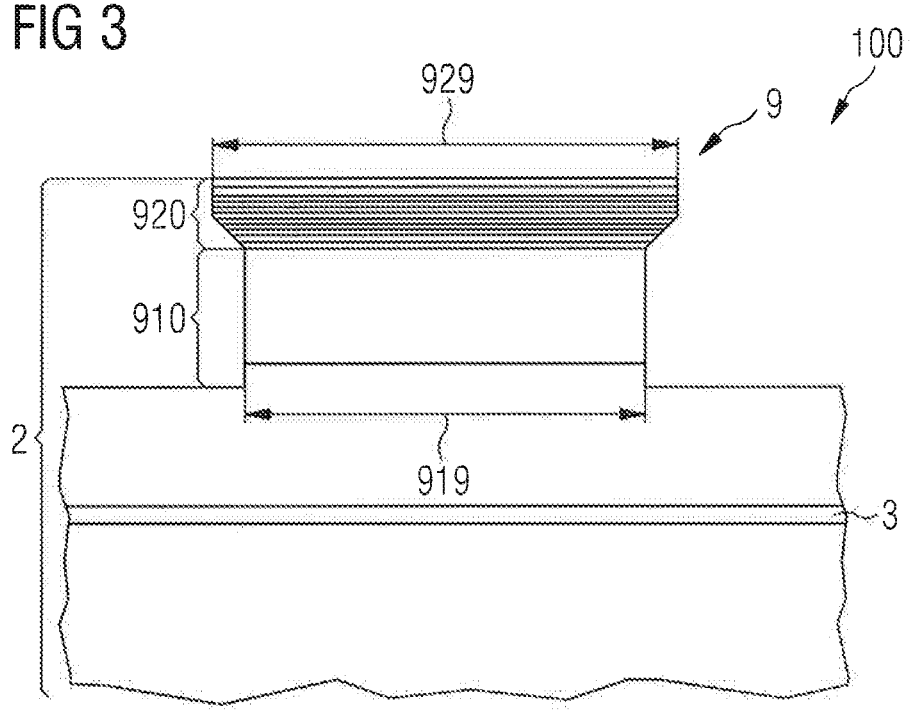

FIG. 3 shows an embodiment in which the ridge waveguide structure 9 in the second region 920, which can be designed as in the previous embodiment, has a width that decreases in the direction towards the active layer 3. Furthermore, the first region 910 is located between the second region 920 and the active layer 3, so that the second region 920 forms a top side region of the ridge waveguide structure 9.

Figure 4:
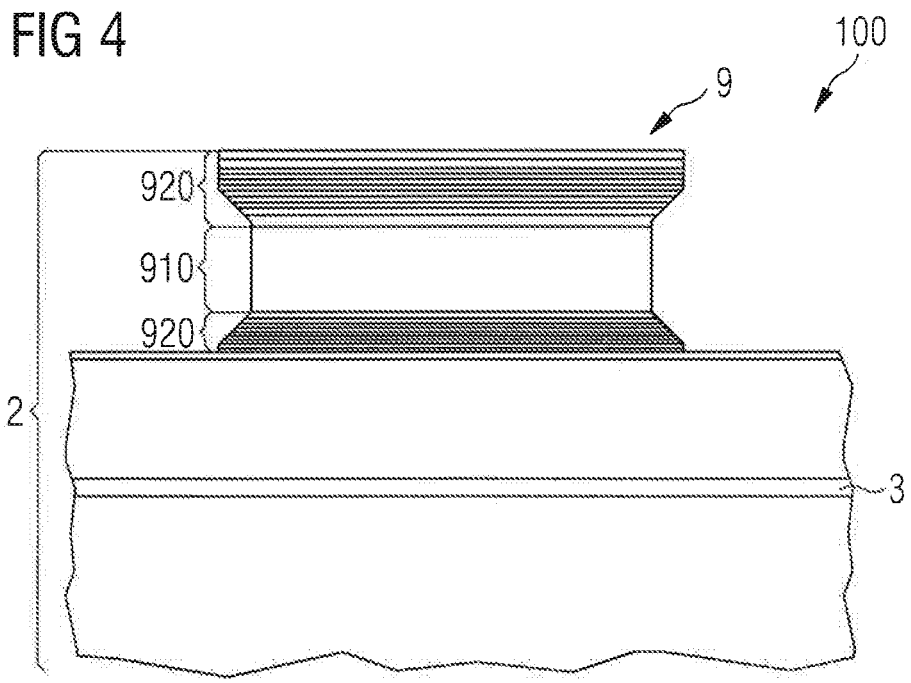

The embodiment of FIG. 4 represents a combination of the embodiments shown in FIGS. 2A, 2B and 3. The ridge waveguide structure 9 of this embodiment has two second regions 920, which are designed as described above and between which the first region 910 is arranged. The two second regions 920 can be the same or different in terms of material and/or width.

Figure 9:
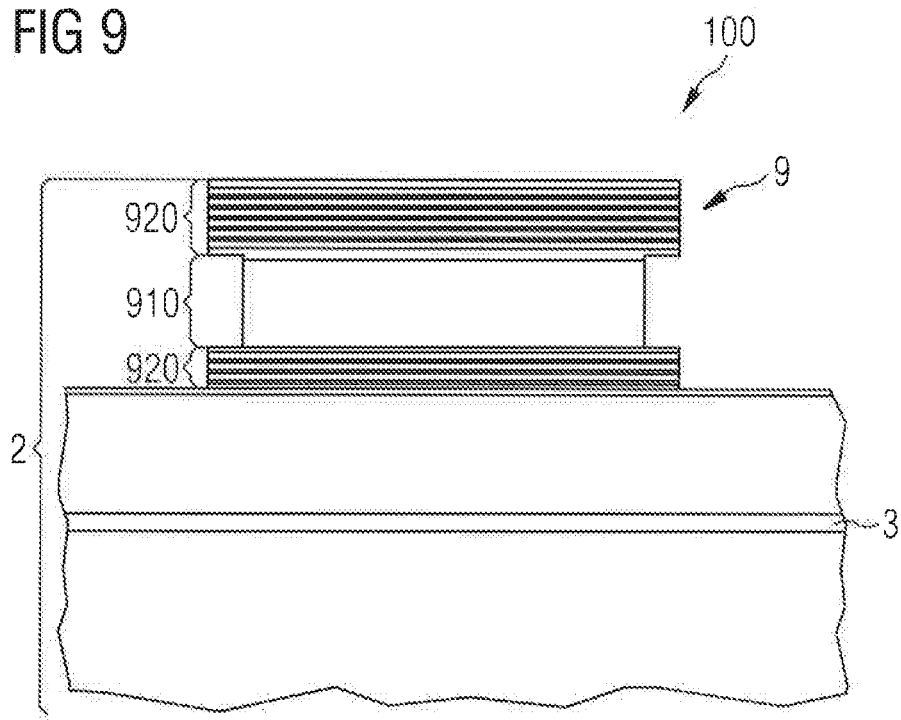

In contrast to the embodiments shown in FIGS. 2A to 4, where the first region 910 is designed with a constant first width 910, the first width 910 may vary depending on the vertical position, as shown in FIGS. 5 and 6. For example, the ridge waveguide structure 9 may widen (FIG. 5) or narrow (FIG. 6) in the first region 910 in the direction towards the active layer 3, the angle being selected such that the corresponding bevel of the ridge side surfaces 11 is less in the first region 910 than in the second region 920, and the ridge waveguide structure 9 may otherwise be preferably designed as explained in connection with FIGS. 2A and 2B or as explained in connection with FIG. 3. Furthermore, as shown in FIGS. 7 to 9, the second region 920 can be formed with non-beveled ridge side surfaces, but can have the same width and form a step with the first region 910, so that the transition from the first region 910 to the second region 920 is stepped with respect to the width.

Figure 10:
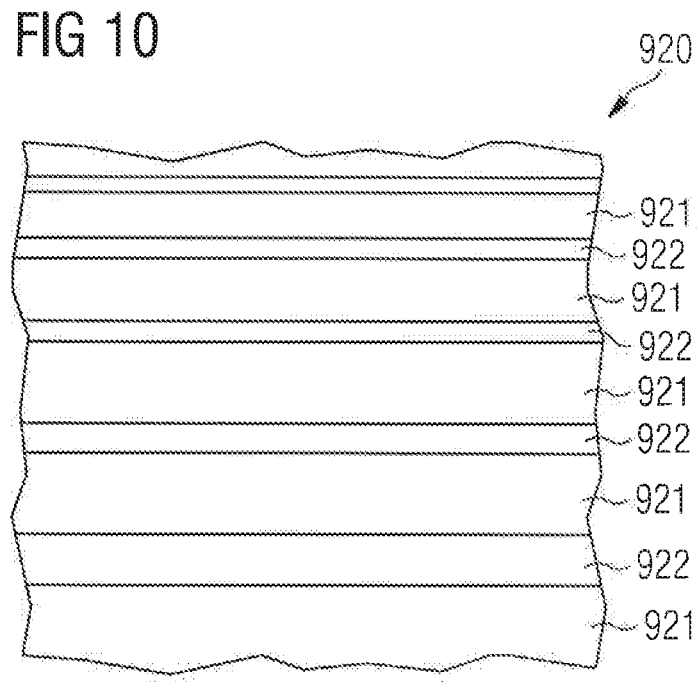

The semiconductor layers 921, 922 of the second region 920 can have the same or different thicknesses. As shown in FIG. 10, the semiconductor layers 921, 922 can vary in distance and thickness as well as in composition.

Figure 11:
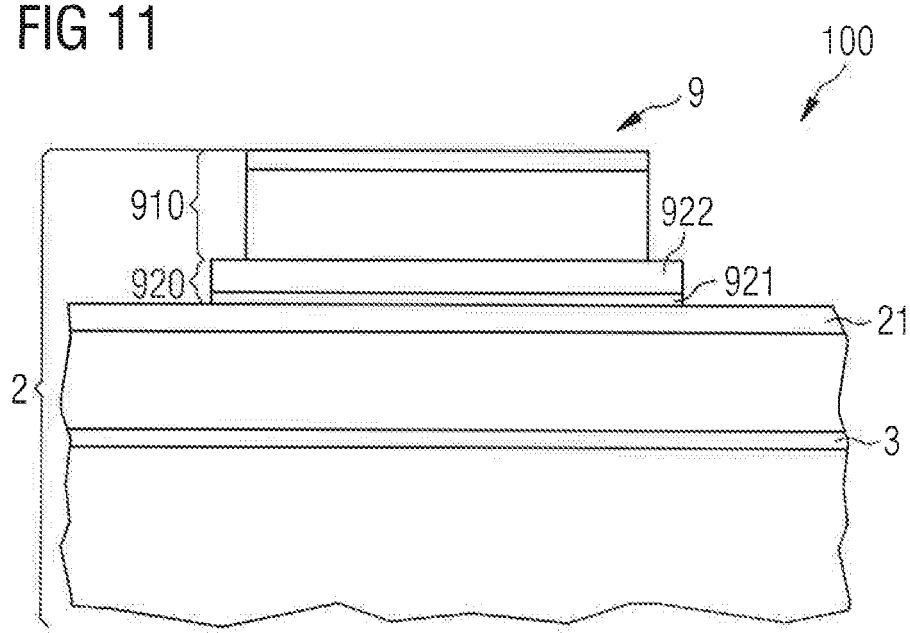
Figure 12:
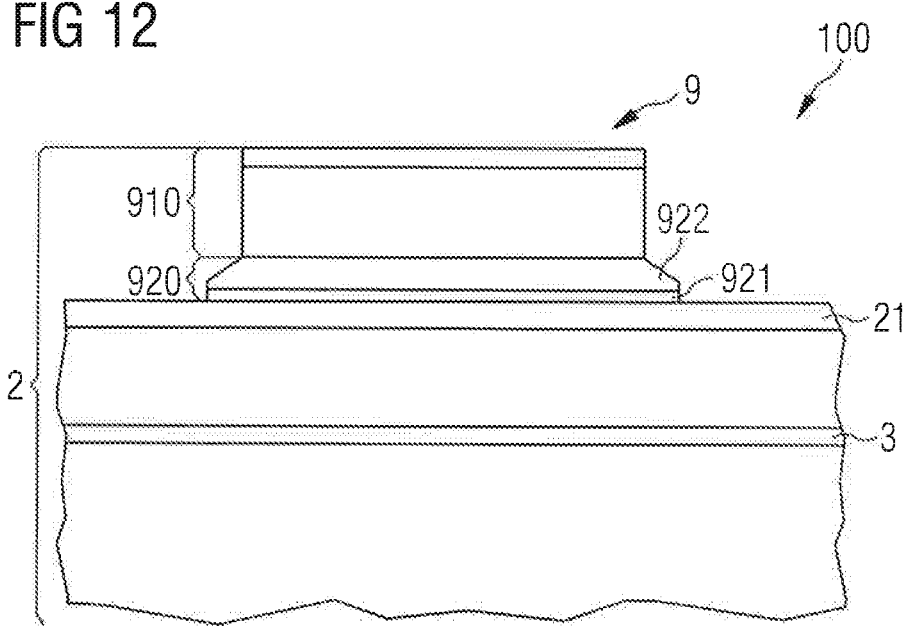

FIGS. 11 and 12 show further embodiments in which the second region 920, which can be stepped or formed with beveled ridge side surfaces, has exactly one hetero-interface compared to the previous embodiments, i.e., exactly two semiconductor layers 921, 922 with different semiconductor materials. Furthermore, it may even be possible that the second region 920 also has exactly one semiconductor layer which forms a hetero-interface with the semiconductor layer of the semiconductor layer sequence adjacent to the ridge waveguide structure 9, i.e., the semiconductor layer which forms the top sides of the semiconductor layer sequence 2 adjacent to the ridge waveguide structure 9 in the lateral direction.

The examples and features shown in the figures are not limited to the combinations shown in the figures. Instead, the shown embodiments as well as individual features can be combined with one another, even if not all possible combinations are explicitly described. In addition, the embodiments described in the figures may have alternative or additional features according to the description in the general part.

The description on the basis of the exemplary embodiments does not limit the invention to these exemplary embodiments. Rather, the invention comprises each new feature and each combination of features, this including, in particular, each combination of features in the claims, even if this feature, or this combination itself, is not explicitly stated in the claims or exemplary embodiments.

What is claimed is:

1. A semiconductor laser diode comprising:
a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction,
wherein the ridge has a first region and a second region adjacent thereto in a vertical direction perpendicular to the longitudinal and lateral directions,
wherein the ridge comprises a first semiconductor material in the first region and at least one second semiconductor material different from the first semiconductor material in the second region,
wherein the ridge has a first width in the first region,
wherein the ridge has a second width in the second region, the second width being larger than the first width,
wherein a transition from the first region to the second region is stepped, and
wherein the second width increases in a direction towards the active layer, or
wherein the second region is arranged between the first region and the active layer, or
wherein the semiconductor layer sequence comprises a semiconductor layer between the active layer and the ridge, and wherein the semiconductor layer is directly adjacent to the second region and comprises the same semiconductor material as the second region, or
wherein the ridge has at least two layers with different semiconductor materials in the second region, or
wherein the ridge has a periodic sequence of a plurality of at least two layers in the second region, or
wherein the first width decreases in a direction towards the active layer.

2. The semiconductor laser diode according to claim 1, wherein the second width increases in the direction towards the active layer.

3. The semiconductor laser diode according to claim 1, wherein the second region is arranged between the first region and the active layer.

4. The semiconductor laser diode according to claim 1, wherein the second region forms a pedestal region of the ridge.

5. The semiconductor laser diode according to claim 1, wherein the semiconductor layer sequence comprises the semiconductor layer between the active layer and the ridge, and wherein the semiconductor layer is directly adjacent to the second region and comprises the same semiconductor material as the second region.

6. The semiconductor laser diode according to claim 1, wherein the second width decreases in a direction towards the active layer.

7. The semiconductor laser diode according to claim 1, wherein the first region is arranged between the second region and the active layer.

8. The semiconductor laser diode according to claim 1, wherein the second region forms an upper side region of the ridge.

9. The semiconductor laser diode according to claim 1, wherein the ridge has at least one hetero-interface in the second region.

10. The semiconductor laser diode according to claim 1, wherein the ridge has at least the two layers with different semiconductor materials in the second region.

11. The semiconductor laser diode according to claim 1, wherein the ridge has the periodic sequence of the plurality of at least two layers in the second region.

12. The semiconductor laser diode according to claim 1, wherein the first width increases in a direction towards the active layer.

13. The semiconductor laser diode according to claim 1, wherein the first width decreases in the direction towards the active layer.

14. The semiconductor laser diode according to claim 1, wherein the ridge has two second regions between which the first region is arranged, and wherein each second region comprises the second semiconductor material and has a greater width than the first region.

15. The semiconductor laser diode according to claim 1, wherein the ridge has a ridge height in the vertical direction and the second region has a height in the vertical direction which is greater than or equal to 2% and less than or equal to $6_5$% of the ridge height.

16. The semiconductor laser diode according to claim 1, wherein the ridge has a maximum first width $B_{max,1}$ in the first region and a maximum second width $B_{max,2}$ in the second region with $\Delta B=(B_{max,2}-B_{max,1})/2$ and with $0.01\% \leq \Delta B/B_{max,1} \leq 20\%$.

17. The semiconductor laser diode according to claim 16, wherein AB fulfills the following: 2 nm AB woo nm.

18. The semiconductor laser diode according to claim 1, wherein, in the second region, the ridge side surfaces are inclined to a plane spanned by the lateral and longitudinal directions by an angle $\alpha$ to which applies: $20° \leq \alpha \leq 100°$.

19. The semiconductor laser diode according to claim 1, wherein the first semiconductor material comprises AlGaN and the second semiconductor material comprises $Al_xIn_yGa_{1-x-y}N$ with $0 \leq x \leq 0.2$ and $0 \leq y \leq 0.2$.

20. A semiconductor laser diode comprising:
a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction,
wherein the ridge has a first region and a second region adjacent thereto in a vertical direction perpendicular to the longitudinal and lateral directions,
wherein the ridge comprises a first semiconductor material in the first region and at least one second semiconductor material different from the first semiconductor material in the second region,
wherein the ridge has a first width in the first region,
wherein the ridge has a second width in the second region, the second width being larger than the first width,
wherein the second width decreases in a direction towards the active layer, and
wherein the ridge has a periodic sequence of a plurality of at least two layers in the second region.

21. A semiconductor laser diode comprising:
a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction,
wherein the ridge has a first region and a second region adjacent thereto in a vertical direction perpendicular to the longitudinal and lateral directions,
wherein the ridge comprises a first semiconductor material in the first region and at least one second semiconductor material different from the first semiconductor material in the second region, wherein the ridge has a first width in the first region, wherein the ridge has a second width in the second region, the second width being larger than the first width, wherein the first region is arranged between the second region and the active layer, and wherein the ridge has a periodic sequence of a plurality of at least two layers in the second region.

22. A semiconductor laser diode comprising:

a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction, wherein the ridge has a first region and a second region adjacent thereto in a vertical direction perpendicular to the longitudinal and lateral directions, wherein the ridge comprises a first semiconductor material in the first region and at least one second semiconductor material different from the first semiconductor material in the second region, wherein the ridge has a first width in the first region, wherein the ridge has a second width in the second region, the second width being larger than the first width, wherein the second region forms an upper side region of the ridge, and wherein the ridge has a periodic sequence of a plurality of at least two layers in the second region.

23. A semiconductor laser diode comprising:

a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction, wherein the ridge has a first region and a second region adjacent thereto in a vertical direction perpendicular to the longitudinal and lateral directions, wherein the ridge comprises a first semiconductor material in the first region and at least one second semiconductor material different from the first semiconductor material in the second region, wherein the ridge has a first width in the first region, wherein the ridge has a second width in the second region, the second width being larger than the first width, wherein the first width decreases in a direction towards the active layer, and wherein the ridge has a periodic sequence of a plurality of at least two layers in the second region.

24. A semiconductor laser diode comprising:

a semiconductor layer sequence having at least one active layer and a ridge waveguide structure having a ridge extending in a longitudinal direction from a light output surface to a rear side surface and being delimited by ridge side surfaces in a lateral direction perpendicular to the longitudinal direction, wherein the ridge has a first region and a second region adjacent thereto in a vertical direction perpendicular to the longitudinal and lateral directions, wherein the ridge comprises a first semiconductor material in the first region and at least one second semiconductor material different from the first semiconductor material in the second region, wherein the ridge has a first width in the first region, wherein the ridge has a second width in the second region, the second width being larger than the first width, wherein the ridge has two second regions between which the first region is arranged, and wherein each second region comprises the second semiconductor material and has a greater width than the first region.

* * * * *

UNITED STATES PATENT AND TRADEMARK OFFICE
CERTIFICATE OF CORRECTION

PATENT NO. : 10,615,572 B2  
APPLICATION NO. : 16/101147  
DATED : April 7, 2020  
INVENTOR(S) : Gerhard et al.

Page 1 of 1

It is certified that error appears in the above-identified patent and that said Letters Patent is hereby corrected as shown below:

In the Claims

In Column 14, Line 26, Claim 17, delete "wherein AB fulfills the following: 2 nm AB woo nm" and insert --wherein $\Delta B$ fulfills the following: $2 \text{ nm} \leq \Delta B \leq 1000 \text{ nm}$--.

Signed and Sealed this  
Eighteenth Day of August, 2020

Andrei Iancu  
*Director of the United States Patent and Trademark Office*